(12) United States Patent
Wang et al.

(10) Patent No.: US 11,861,097 B2
(45) Date of Patent: Jan. 2, 2024

(54) DISPLAY DEVICE

(71) Applicants: Chengdu BOE Optoelectronics Technology Co., Ltd., Sichuan (CN); BOE Technology Group Co., Ltd., Beijing (CN)

(72) Inventors: Chao Wang, Beijing (CN); Binfeng Feng, Beijing (CN); Fei Li, Beijing (CN); Zijie Zhang, Beijing (CN); Yonghui Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 746 days.

(21) Appl. No.: 16/957,443

(22) PCT Filed: Jul. 8, 2019

(86) PCT No.: PCT/CN2019/095118
§ 371 (c)(1),
(2) Date: Jun. 24, 2020

(87) PCT Pub. No.: WO2021/003640
PCT Pub. Date: Jan. 14, 2021

(65) Prior Publication Data
US 2023/0104812 A1    Apr. 6, 2023

(51) Int. Cl.
*G06F 3/041* (2006.01)
*H05K 1/18* (2006.01)

(52) U.S. Cl.
CPC ........ *G06F 3/04164* (2019.05); *G06F 3/0412* (2013.01); *H05K 1/189* (2013.01);
(Continued)

(58) Field of Classification Search
None
See application file for complete search history.

(56) References Cited

U.S. PATENT DOCUMENTS 9,946,302 B2 *  4/2018  Franklin ............... C03C 21/002
2010/0060601 A1  3/2010  Oohira
(Continued)

FOREIGN PATENT DOCUMENTS

CN   205266019 U   5/2016
CN   206879210 U   1/2018
(Continued)

OTHER PUBLICATIONS

Translation of CN 108563363 A into English; Luo et al. (Year: 2018).*
(Continued)

*Primary Examiner* — Brian M Butcher
(74) *Attorney, Agent, or Firm* — Lippes Mathias, LLP

(57) ABSTRACT

The present disclosure provides a display device including a display panel; a touch panel; a polarizer; a touch flexible printed circuit board, which includes a first portion, a second portion and a bending portion connecting the first portion and the second portion; a cover plate; a first adhesive layer; and a cushion layer, which is disposed between the first portion and the first adhesive layer. An orthographic projection of the polarizer on a reference plane falls outside an orthographic projection of the first portion on the reference plane, and the reference plane is a plane in which a touch surface of a touch panel is disposed. The polarizer and the first portion of the TFPC are arranged separately.

20 Claims, 6 Drawing Sheets

(52) U.S. Cl.
CPC .............. *G06F 2203/04102* (2013.01); *H05K 2201/10128* (2013.01)

(56) References Cited

U.S. PATENT DOCUMENTS

| | | |
|---|---|---|
| 2014/0347578 A1 | 11/2014 | Yamada et al. |
| 2017/0277313 A1* | 9/2017 | Lee .................. G06F 3/0412 |
| 2017/0324058 A1 | 11/2017 | Min |
| 2020/0183523 A1 | 6/2020 | Luo et al. |

FOREIGN PATENT DOCUMENTS

| | | |
|---|---|---|
| CN | 207637131 U | 7/2018 |
| CN | 108563363 A | 9/2018 |
| CN | 109254696 A | 1/2019 |
| KR | 20140069680 A | 6/2014 |

OTHER PUBLICATIONS

International search report of PCT application No. PCT/CN2019/095118 dated Apr. 8, 2020.
Extended European search report of counterpart European application No. 19932247.0 dated Jun. 14, 2022.

* cited by examiner

DISPLAY DEVICE

CROSS-REFERENCE TO RELATED APPLICATION

The application is a 371 of PCT Application No. PCT/CN2019/095118 filed on Jul. 8, 2019, the entire contents of which are incorporated herein by reference.

TECHNICAL FIELD

The present disclosure relates to the field of touch display technology, and more particularly to a display device.

BACKGROUND

Display devices are becoming more and more popular for touch function thereof.

The display device includes a display panel, a touch panel, a polarizer and a touch flexible printed circuit board (TFPC).

SUMMARY

Embodiments of the present disclosure provide a display device. The technical solution are as follows:

In a first aspect, a display device is provided. The display device includes:
  a display panel;
  a touch panel, disposed on a display side of the display panel;
  a polarizer, disposed on a side, distal from the display panel, of the touch panel;
  a touch flexible printed circuit board, including a first portion, a second portion, and a bending portion connecting the first portion and the second portion; wherein the first portion is disposed between the display panel and the polarizer, and the second portion is disposed on a non-display side of the display panel; the first portion is provided with a first connection terminal, and the touch panel is provided with a second connection terminal, the first connection terminal being electrically connected to the second connection terminal;
  a cover plate, disposed on a side, distal from the touch panel, of the polarizer;
  a first adhesive layer, disposed between the cover plate and the polarizer; and
  a cushion layer, disposed between the first portion and the first adhesive layer,
  wherein an orthographic projection of the polarizer on a reference plane falls within an orthographic projection of the first portion on the reference plane, and the reference plane is a plane in which a touch surface of the touch panel is disposed.

Optionally, a surface, distal from the touch panel, of the cushion layer is substantially flush with a surface, distal from the touch panel, of the polarizer.

Optionally, an orthographic projection of the cushion layer on the reference plane substantially coincides with an orthographic projection of the first portion on the reference plane.

Optionally, the orthographic projection of the polarizer on the reference plane includes a notch, and an orthographic projection of the first portion on the reference plane is disposed within the notch.

Optionally, a minimum spacing between the polarizer and the first portion is greater than or equal to 0.23 mm in a direction parallel to the reference plane.

Optionally, a minimum spacing between the polarizer and the first portion is greater than or equal to 0.3 mm.

Optionally, the cushion layer includes a polyethylene terephthalate PET substrate as well as a first adhesive and a second adhesive that are stacked on both sides of the PET substrate.

Optionally, the touch flexible printed circuit board includes a first insulating layer, a first circuit layer, and a second insulating layer that are stacked in sequence along a direction distal from the touch panel;
  wherein the first insulating layer includes a first insulating portion and a second insulating portion; the first circuit layer includes a first circuit portion, a second circuit portion, and a third circuit portion; and the second insulating layer includes a third insulating portion, a fourth insulating portion, and a fifth insulating portion; and
  the first portion includes the first circuit portion and the third insulating portion; the second portion includes the second insulating portion, the third circuit portion, and the fifth insulating portion; the bending portion includes the first insulating portion, the second circuit portion, and the fourth insulating portion; the first insulating portion is made of a thermosetting ink, the thermosetting ink being a heat-set ink; and the first circuit unit is provided with the first connection terminal.

Optionally, the thermosetting ink includes a green thermosetting ink.

Optionally, the second insulating portion and the second insulating layer are both made of a second material, and the second material includes a composite material of polyimide and a pressure sensitive adhesive.

Optionally, the first insulating portion includes a target insulating pattern and a composite insulating pattern, and the second insulating portion and the composite insulating pattern are of an integral structure;
  the composite insulating pattern includes a hollow-out portion, and the target insulating pattern is disposed within the hollow-out portion of the composite insulating pattern; the target insulating pattern is made of the thermosetting ink, and the composite insulating pattern is made of the second material; and a thickness of the target insulating pattern is less than that of the composite insulating pattern.

Optionally, the target insulating pattern includes a plurality of insulating blocks spaced apart along a bending direction of the bending portion.

Optionally, the second portion includes a first thickness region and a second thickness region; the touch flexible printed circuit board further includes a second circuit layer and a third insulating layer; wherein
  a thickness of the first thickness region is greater than that of the second thickness region; and orthographic projections of boundary lines of the first thickness region and the second thickness region on the reference plane fall outside an orthographic projection of a display region of the display panel on the reference plane; and
  the first thickness region includes the second insulating portion, the third circuit portion, the fifth insulating portion, the second circuit layer, and the third insulating layer that are stacked in sequence along a direction distal from the display panel.

Optionally, the display device further includes:

a touch drive circuit, disposed on a side, proximal to the display panel, of the second portion and electrically connected to the second portion.

Optionally, the cover plate includes a center region and an edge region; wherein
a thickness of the edge region gradually decreases in a direction distal from the center region; the edge region includes a first subregion and a second subregion that are opposite to each other, and a third subregion, and a fourth subregion that are opposite to each other; and the center region is disposed between the first subregion and the second subregion and between the third subregion and the fourth subregion;
wherein an orthographic projection of a boundary line in which the first subregion is thinned on the reference plane falls outside an orthographic projection of the display region of the display panel on the reference plane; orthographic projections of boundary lines in which the second subregion, the third subregion, and the fourth subregion are thinned on the reference plane all fall within the orthographic projection of the display region on the reference plane and are proximal to an orthographic projection of an edge of the display region on the reference plane.

Optionally, an edge of the touch panel is substantially flush with an edge of the cushion layer.

Optionally, the display device further includes a second adhesive layer, wherein the second adhesive layer is disposed between the display panel and the touch panel; and
the display panel includes a polyethylene terephthalate PET tape and a buffer foam, wherein edges, proximal to the bending portion, of the second adhesive layer, the PET tape and the buffer foam are substantially flush, and orthographic projections of the edges of the second adhesive layer, the PET tape, and the buffer foam on the reference plane fall within the orthographic projection of the cushion layer on the reference plane.

Optionally, the display panel further includes a first panel portion, a bending panel portion, and a second panel portion that are connected in sequence, wherein thicknesses of regions, proximal to the bending panel portion, of the first panel portion and the second panel portion are the same as the thickness of the bending panel portion, and thicknesses of portions, distal from the bending panel portion, of the first panel portion and the second panel portion are greater than the thickness of the bending panel portion.

Optionally, a boundary, proximal to the first portion, of the bending panel portion is more proximal to a center of the display region of the display panel than a boundary, proximal to the first portion, of the bending portion; and
a boundary, proximal to the second portion, of the bending panel portion is more proximal to the center of the display region of the display panel than a boundary, proximal to the second portion, of the bending portion.

Optionally, the display device further includes a coating layer,
wherein the coating layer covers a surface, proximal to the touch flexible printed circuit board, of the bending panel portion, and surfaces of portions, proximal to the bending panel portion, of the first panel portion and the second panel portion.

Optionally, edges of the PET tape and the buffer foam are disposed on thicker portions of the first panel portion and the second panel portion, and orthographic projections of the edges of the PET tape and the buffer foam on the reference plane fall within an orthographic projection of the coating layer on the reference plane.

Optionally, the display device further includes an insulating protective film, disposed on a side, distal from the display panel, of the second portion of the touch flexible printed circuit board.

Optionally, the display device further includes an ink layer, disposed between an edge region of the cover plate and the first adhesive layer.

In a second aspect, a display device is provided. The display device includes:
a display panel;
a touch panel, disposed on a display side of the display panel;
a polarizer, disposed on a side, distal from the display panel, of the touch panel; and
a touch flexible printed circuit board, including a first portion, a second portion and a bending portion connecting the first portion and the second portion; wherein the first portion is disposed between the display panel and the polarizer, and the second portion is disposed on a non-display side of the display panel; the first portion is provided with a first connection terminal, and the touch panel is provided with a second connection terminal, the first connection terminal being electrically connected to the second connection terminal,
wherein an orthographic projection of the polarizer on a reference plane falls outside an orthographic projection of the first portion on the reference plane, and the reference plane is a plane in which a touch surface of the touch panel is disposed.

Optionally, the display device further includes:
a cushion layer, disposed on a side, distal from the touch panel, of the first portion.

Optionally, a surface, distal from the touch panel, of the cushion layer is substantially flush with a surface, distal from the touch panel, of the polarizer.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the principles, technical solutions, and advantages in the present disclosure, the implementation of the present disclosure is described in detail below in combination with the accompanying drawings.

Figure 1:
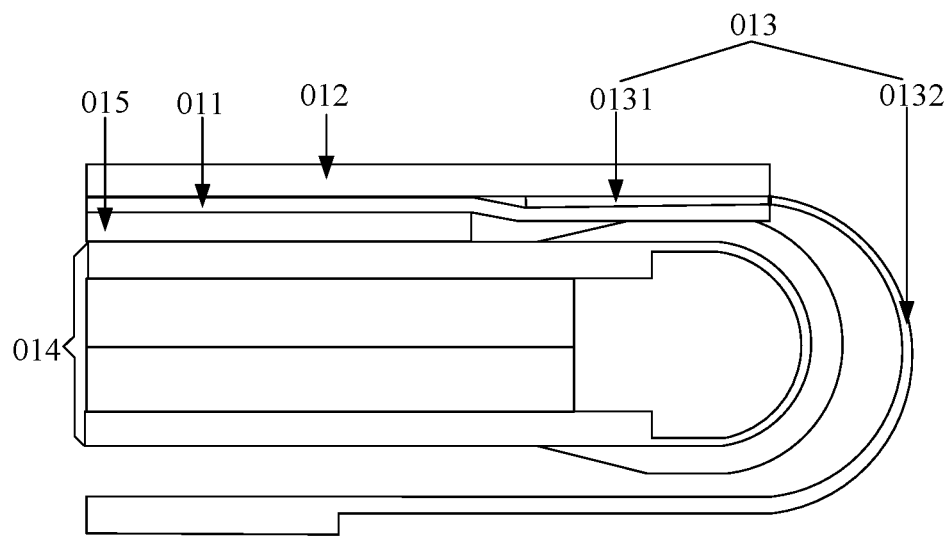
FIG. 1 is a schematic partial structural diagram of a display device according to an embodiment of the present disclosure.

FIG. 1 is a schematic partial structural diagram of a display device according to an embodiment of the present disclosure. As shown in FIG. 1, the display device 01 includes a touch panel 011, a polarizer 012 and a TFPC 013. The touch panel 011 and the polarizer 012 are superimposed. The TFPC 013 includes a first portion 0131 and a connecting portion 0132 that are connected to each other. The first portion 0131 is inserted between the touch panel 011 and the polarizer 012 and electrically connected with the touch panel 011. The connecting portion 0132 is bent to a side, distal from the polarizer 012, of the touch panel 011.

Optionally, as shown in FIG. 1, the display device 01 may further include a display panel 014, a cover plate (not shown in FIG. 1), an optically clear adhesive (OCA for short) 015, and the like. The display panel 014 is disposed between the touch panel 011 and the connecting portion 0132, the OCA 015 is disposed between the display panel 014 and the touch panel 011, and the cover plate is disposed on a side, distal from the touch panel 011, of the polarizer 012.

It should be noted that, since the first portion 0131 of the TFPC 013 is inserted between the touch panel 011 and the polarizer 012, a height difference is present between a portion, Which is in contact with the TFPC 013, of the touch panel 011 and other portions of the touch panel 013 (such as a portion, which is in contact with the polarizer 012, of the touch panel 011). Therefore, the touch panel 011 is more likely to break under the action of the height difference. An embodiment of the present disclosure provides another display device. The touch panel 011 in the display device is less likely to break.

Figure 2:
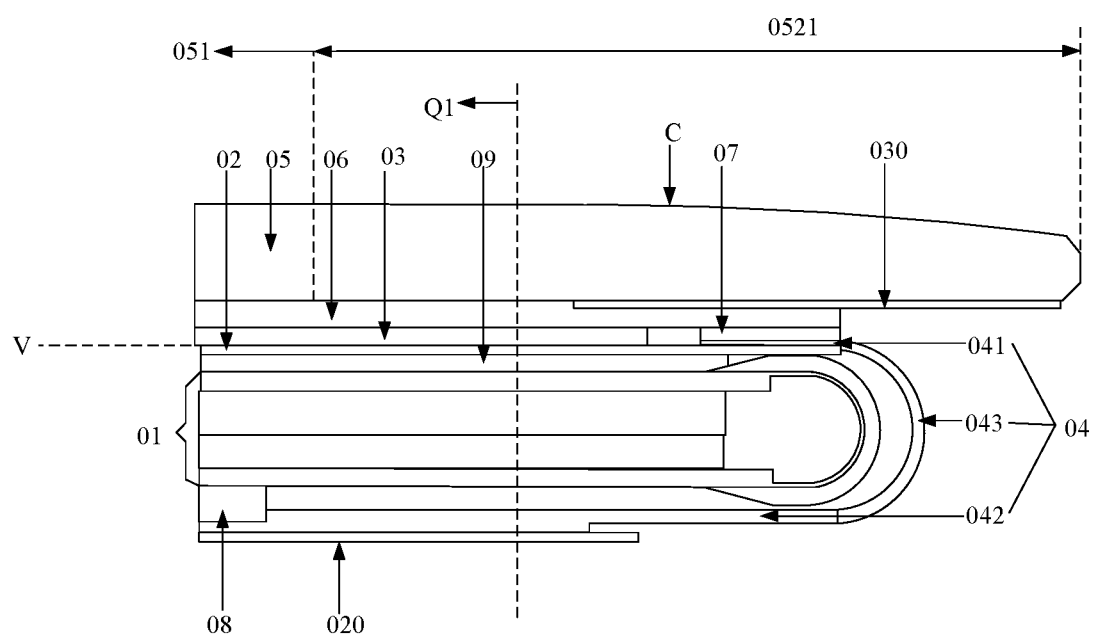
FIG. 2 is a schematic partial structural diagram of another display device according to an embodiment of the present disclosure.

For example, FIG. 2 is a schematic partial structural diagram of another display device according to an embodiment of the present disclosure. As shown in MG. 2, the display device 02 includes a display panel 01, a touch panel 02, a polarizer 03, a cushion layer 07, a TFPC 04, a cover plate 05, and a first adhesive layer 06.

Among them, the touch panel 02 is disposed on a display side of the display panel 01, and the polarizer 03 is disposed on a side, distal from the display panel 01, of the touch panel 02.

The TFPC 04 includes a first portion 041, a second portion 042, and a bending portion 043 connecting the first portion 041 and the second portion 042. The first portion 041 is disposed on a side, distal from the display panel 01, of the touch panel 02, and the second portion 042 is disposed on a non-display side of the display panel 01 (that is, a lower side of the display panel 01 in FIG. 2). The first portion 041 is provided with a first connection terminal, and the touch panel 02 is provided with a second connection terminal. The first connection terminal is electrically connected to the second connection terminal.

The cover plate 05 is disposed on a side, distal from the touch panel 02, of the polarizer 03. The first adhesive layer 06 is disposed between the cover plate 05 and the polarizer 03. The cushion layer 07 is disposed between the first portion 041 and the first adhesive layer 06. An orthographic projection of the polarizer 03 on a reference plane V falls outside an orthographic projection of the first portion 041 on the reference plane V. The reference plane V is a plane in which a touch surface of the touch panel 02 is disposed.

In summary, in the display device according to the embodiment of the present disclosure, the polarizer and the first portion of the TFPC are arranged separately, which may avoid the superposition of the TFPC and the polarizer and ensure that there is no height difference between a portion, which is in contact with the TFPC, of the touch panel and other portions of the touch panel. Accordingly, the risk of breakage of the touch panel is reduced.

Moreover, under the action of the cushion layer, the TFPC may be stuck between the cushion layer and the touch panel, enhancing the stability of the TFPC and further reducing the probability of the breakage of the TFPC when the TFPC is bent. Optionally, a surface, distal from the touch panel 02, of the cushion layer 07 may be substantially flush with a surface, distal from the touch panel 02, of the polarizer 03. As such, the flatness of one side, distal from the touch panel 02, of the polarizer 03 is higher. The description that the two surfaces are substantially flush means that the two surfaces are completely flush, or the two surfaces are not completely flush, but a distance between the two surfaces is smaller (for example, less than a distance threshold). For example, the range of the distance threshold may be 10 microns to 100 microns, or 10 microns to 20 microns, or the like. In FIG. 2, it is exemplified that a surface, distal from the touch panel 02, of the cushion layer 07 is completely flush with a surface, distal from the touch panel 02, of the polarizer 03.

Optionally, an edge of the touch panel 02 is substantially flush with an edge of the cushion layer 07.

Optionally, an orthographic projection of the cushion layer 07 on the reference plane V may substantially coincide with an orthographic projection of the first portion 041 on the reference plane V. The description that the two orthographic projections substantially coincide means that the two orthographic projections completely coincide, or a deviation is present with respect to centers of the two orthographic projections, wherein the deviation is less than a deviation threshold. In FIG. 2, it is exemplified that the orthographic projection of the cushion layer 07 on the reference plane V completely coincides with the orthographic projection of the first portion 041 on the reference plane V.

Figure 3:
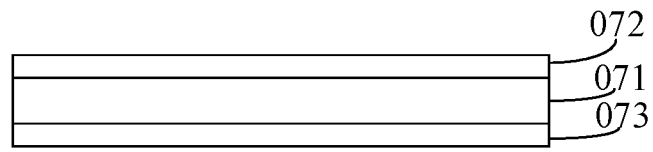
FIG. 3 is a schematic structural diagram of a cushion layer according to an embodiment of the present disclosure.

Optionally, FIG. 3 is a schematic structural diagram of a cushion layer according to an embodiment of the present disclosure. As shown in FIG. 3, the cushion layer 07 may include a polyethylene terephthalate (PET) substrate 071, and a first adhesive 072 and a second adhesive 073 that are stacked on both sides of the PET substrate 071. Under the action of the first adhesive 072 and the second adhesive 073, the cushion layer 07 is sticky. Therefore, the cushion layer 07 may be firmly fixed to the first portion 041 of the TFPC 04, and thus the cushion layer 07 may be prevented from falling off and the stability of the TFPC 04 is enhanced. Optionally, the first adhesive 072 and the second adhesive 073 may be made of a conductive material or an insulating material, which is not limited in the embodiment of the present disclosure.

It should be noted that in the embodiment of the present disclosure, the polarizer 03 and the first portion 041 of the TFPC 04 are arranged separately. As such, the polarizer 03 and the first portion 041 may have various shapes. The two shapes of the polarizer 03 and the first portion 041 are described as examples hereinafter.

Figure 4:
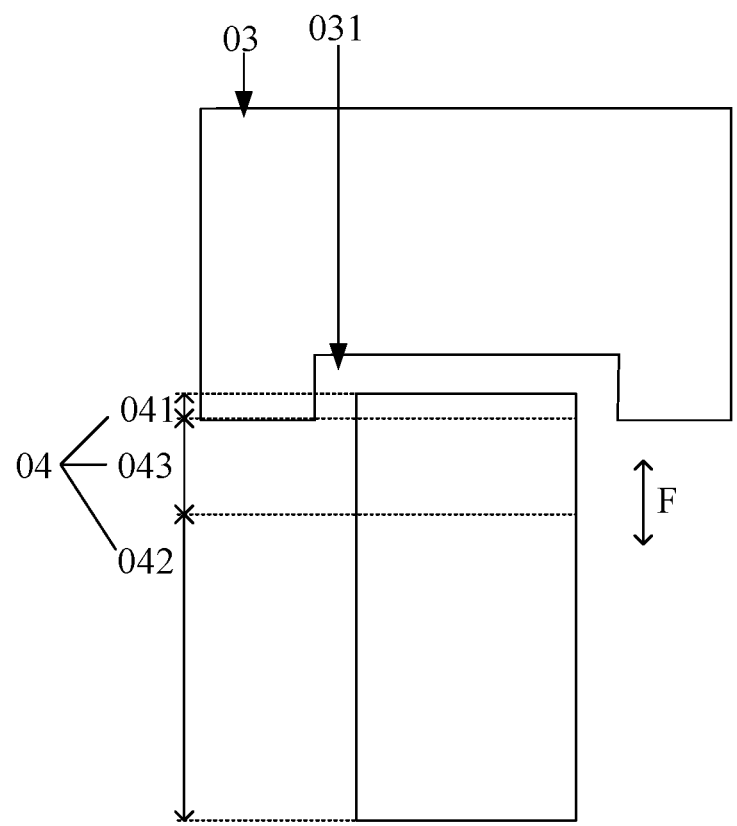
FIG. 4 is a schematic diagram showing shapes of a polarizer and a TFPC according to an embodiment of the present disclosure.

Further, FIG. 4 is a schematic diagram showing shapes of a polarizer and a TFPC according to an embodiment of the present disclosure. A touch panel 02 is not shown in FIG. 4, and a bending portion 043 in the TFPC in FIG. 4 is not in a bent state. Still referring to FIG. 2 and FIG. 4, an orthographic projection of the polarizer 03 on the reference plane V in FIG. 2 may include a notch 031, and an orthographic projection of the first portion 041 on the reference plane V in FIG. 2 falls within the notch 031. In this case, the polarizer 03 half-encloses the first portion 041 of the TFPC 04, and the area of the polarizer 03 is greater. In addition, in FIG. 3, the notch 031 is exemplarily rectangular. Optionally, the notch 031 may further be circular, semicircular, elliptical, irregular, or the like, which is not limited in the embodiment of the present disclosure.

Figure 5:
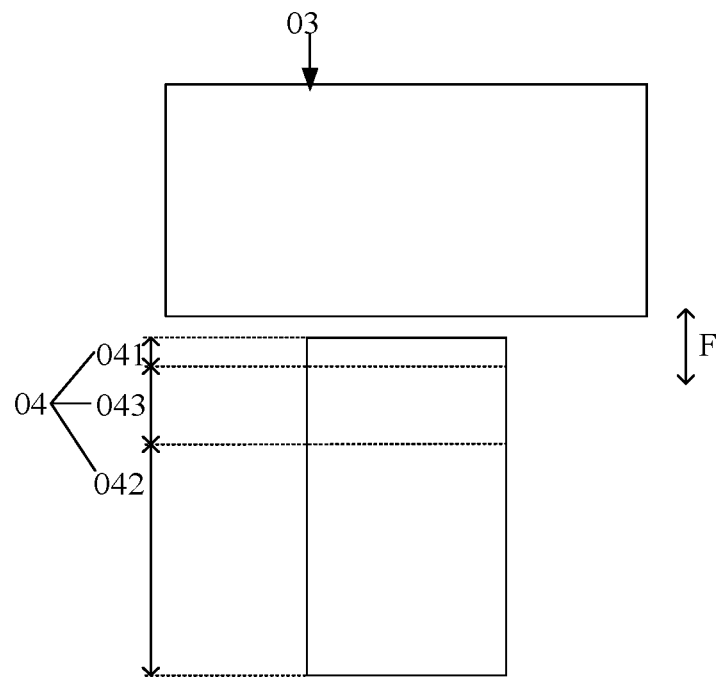
FIG. 5 is a schematic diagram showing shapes of another polarizer and a first portion according to an embodiment of the present disclosure.

In addition, FIG. 5 is a schematic diagram showing shapes of another polarizer and a first portion according to an embodiment of the present disclosure. A touch panel 02 is not shown in FIG. 5. Referring to FIG. 2 and FIG. 5, an orthographic projection of the polarizer 03 on the touch panel 02 includes no notch, and no overlap is present the orthographic projection of the first portion 041 on the touch panel 02 and the orthographic projection of the polarizer 03 on the touch panel 02.

Further, regardless of the shapes of the polarizer 03 and the first portion 041, in a direction parallel to the reference plane V in FIG. 2, a minimum spacing between the polarizer 03 and the first portion 041 may be greater than or equal to 0.23 mm (for example, the minimum spacing is 0.3 mm, 0.4 mm, and the like). The direction parallel to the reference plane V in FIG. 2 may include a direction of the polarizer towards the first portion, for example, a direction F in FIG. 4 and FIG. 5. The direction parallel to the reference plane V in FIG. 2 may further include another direction different from the direction of the polarizer towards the first portion (for example, a direction perpendicular to the direction F in FIG. 4 and FIG. 5), which is not limited in the embodiment of the present disclosure. Optionally, in the direction parallel to the reference plane V in FIG. 2, the minimum spacing between the polarizer 03 and the first portion 041 may be greater than or equal to 0.3 mm. In the direction parallel to the reference plane V in FIG. 2, the minimum spacing between the polarizer 03 and the first portion 041 may be further greater than or equal to 0.24 mm or 0.4 mm, or the like, which is not limited in the embodiment of the present disclosure.

It should be noted that a size error W1 of the polarizer 03 is about ±0.15 mm; an error W2 when the polarizer 03 is disposed on one side of the touch panel 02 is about ±0.1 mm; an error W3 in the first direction when the first portion 041 of the TFPC is disposed on one side of the touch panel 02 is about ±0.1 mm; an error W4 in the second direction when the first portion 041 of the TFPC 04 is disposed on one side of the touch panel 02 is about ±0.1 mm; and the first direction is perpendicular to the second direction. Considering the existence of W1, W2, W3, and W4, the minimum spacing between the polarizer 03 and the first portion 041 needs to be at least $\sqrt{W1^2+W2^2+W3^2+W4^2} \approx 0.23$ mm. In this way, it is possible to prevent the polarizer 03 and the first portion 041 from being arranged to be proximal to each other, and further prevent the polarizer 03 and the first portion 041 from being superimposed due to one or more of the size error and an operation error.

Figure 6:
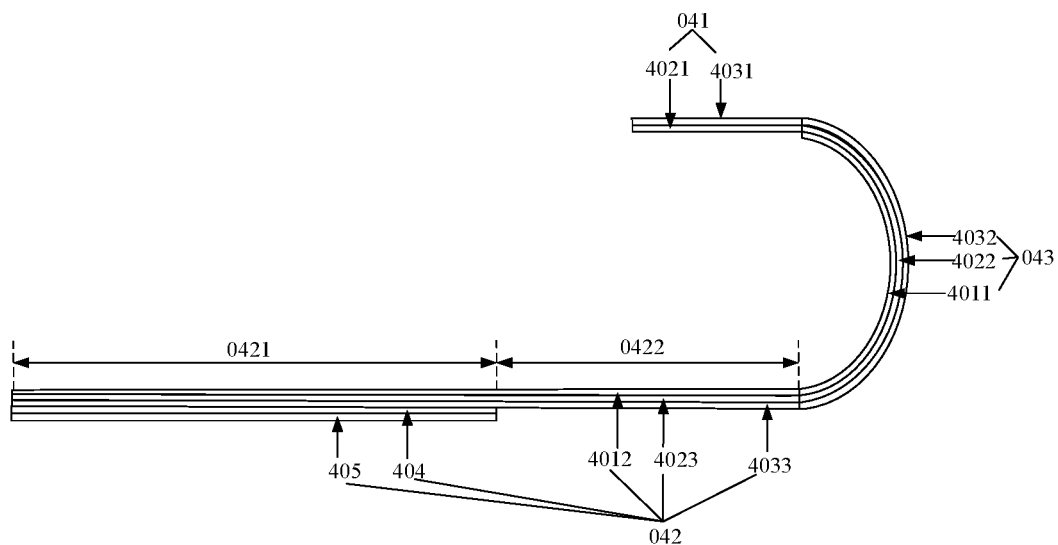
FIG. 6 is a schematic structural diagram of a TFPC according to an embodiment of the present disclosure.

Optionally, FIG. 6 is a schematic structural diagram of a TFPC according to an embodiment of the present disclosure. Referring to FIG. 2 and FIG. 6, as shown in FIG. 2, the TFPC 04 may include a first insulating layer, a first circuit layer, and a second insulating layer that are sequentially stacked in a direction distal from the touch panel 02. The first insulating layer includes a first insulating portion 4011 and a second insulating portion 4012. The first circuit layer includes a first circuit portion 4021, a second circuit portion 4022, and a third circuit portion 4023. The second insulating layer includes a third insulating portion 4031, a fourth insulating portion 4032 and a fifth insulating portion 4033. The first portion 401 in the TFPC 04 includes the first circuit portion 4021 and the third insulating portion 4031, The second portion 402 in the TFPC 04 includes the second insulating portion 4012, the third circuit portion 4023, and the fifth insulating portion 4033. The bending portion 403 in the TFPC 04 includes the first insulating portion 4011, the second circuit portion 4022, and the fourth insulating portion 4032.

Optionally, the TFPC 04 further includes a second circuit layer 404 and a third insulating layer 405. The second portion 042 of the TFPC 04 includes a first thickness region 0421 and a second thickness region 0422. A thickness of the first thickness region 0421 is greater than that of the second thickness region 0422. Moreover, orthographic projections of boundary lines of the first thickness region 0421 and the second thickness region 0422 on the reference plane V in FIG. 2 fall outside an orthographic projection of a display region Q of the display panel 01 in FIG. 2 on the reference plane V. The first thickness region 0421 includes a second insulating portion 4012, a third circuit portion 4023, a fifth insulating portion 4033, a second circuit layer 404, and a third insulating layer 405 that are sequentially stacked in a direction distal from the display panel 01.

The first insulating portion 4011 is made of a thermosetting ink, wherein the thermosetting ink is a heat-set ink. The first circuit portion 4021 is provided with a first connection terminal. For example, the thermosetting ink includes a green thermosetting ink. The flexibility of the thermosetting ink is greater than that of a composite material of polyimide and a pressure sensitive adhesive. Optionally, the thermosetting ink may be a black thermosetting ink or a yellow thermosetting ink, or the thermosetting ink may not include a heat-set ink. For instance, the thermosetting ink includes a light-sensitive ink or the like, which is not limited in the embodiment of the present disclosure.

It should be noted that, in general, the first insulating portion 4011 of the TFPC is made of a composite material of polyimide and a pressure-sensitive adhesive. However, in the embodiment of the present disclosure, the first insulating portion 4011 is made of a thermosetting ink the flexibility of which is greater than that of the composite material. Therefore, the flexibility of the first insulating portion 4011 in the embodiment of the present disclosure is relatively high. In this way, the stress generated when the TFPC 04 is bent may be reduced, and the probability of the breakage of the touch panel 02 under the action of the stress may be lowered.

Figure 7:
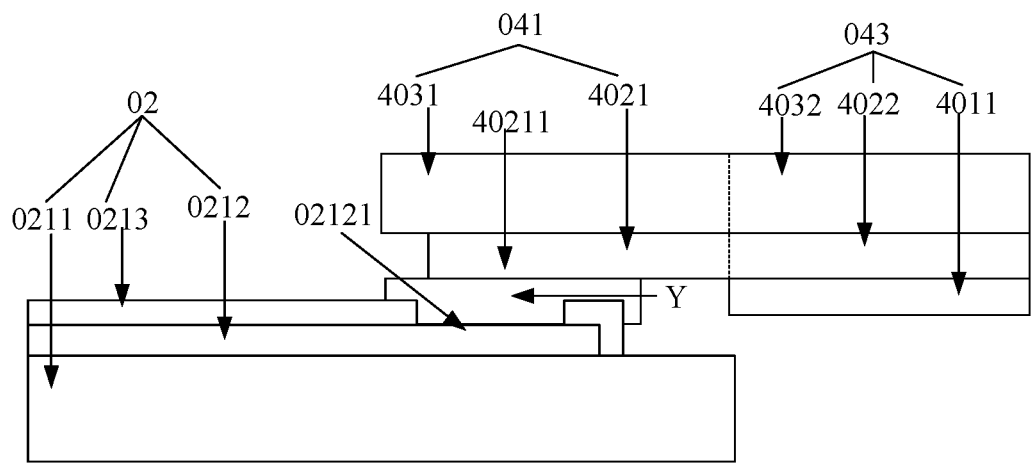
FIG. 7 is a schematic diagram of binding of a TFPC to a touch panel according to an embodiment of the present disclosure.

The first insulating portion 4011 may be only made of a thermosetting ink. At this time, a structure of the first insulating portion 4011 may be as shown in FIG. 6 and FIG. 7. Among them, FIG. 7 is a schematic diagram of binding of a TFPC to a touch panel according to an embodiment of the present disclosure. Moreover, the bending portion 043 in FIG. 7 is not in a bent state. Optionally, the first insulating portion 4011 may include not only a thermosetting ink but also other materials (such as a composite material of polyimide and a pressure-sensitive adhesive). In this case, a structure of the first insulating layer 041 may be implemented in various ways. In addition, referring to FIG. 7, the touch panel 02 may include a panel body 0211, a touch circuit layer 0212, and a touch insulating layer 0213 that are arranged in sequence, and the touch circuit layer 0122 is provided with a second connection terminal 02121, The second connection terminal 02121 is electrically connected to the first connection terminal 40211 of the first circuit unit 4021 in the TFPC 04. For example, the first connection terminal 40211 may be electrically connected to the second connection terminal 02121 by a conductive adhesive Y.

Figure 9:
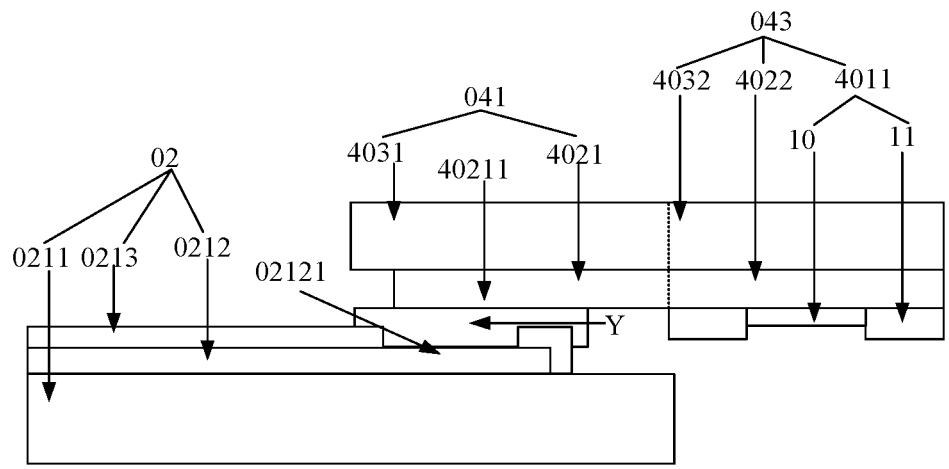
FIG. 9 is schematic diagram of binding of another TFPC to a touch panel according to an embodiment of the present disclosure.

For example, FIG. 5 is a schematic diagram showing a shape of a first insulating layer according to an embodiment of the present disclosure. FIG. 9 is a schematic diagram of binding of another TFPC to a touch panel according to an embodiment of the present disclosure. Referring to FIG. 5 and FIG. 9, the first insulating portion 4011 includes a target insulating pattern 10 and a composite insulating pattern 11, and the second insulating portion 4012 and the composite insulating pattern 11 are of an integral structure. The composite insulating pattern 11 includes a hollow-out portion, and the target insulating pattern 10 is disposed within the hollow-out portion of the composite insulating pattern 11. The target insulating pattern 10 is made of a thermosetting ink, and the composite insulating pattern 11 is made of a composite material of polyimide and a pressure sensitive adhesive. In FIG. 9, it is exemplified that a thickness of the target insulating pattern 10 is less than that of the composite insulating pattern 11, or a thickness of the target insulating pattern 10 is greater than or equal to that of the composite insulating pattern 11, which is not limited in the embodiment of the present disclosure.

Figure 8:
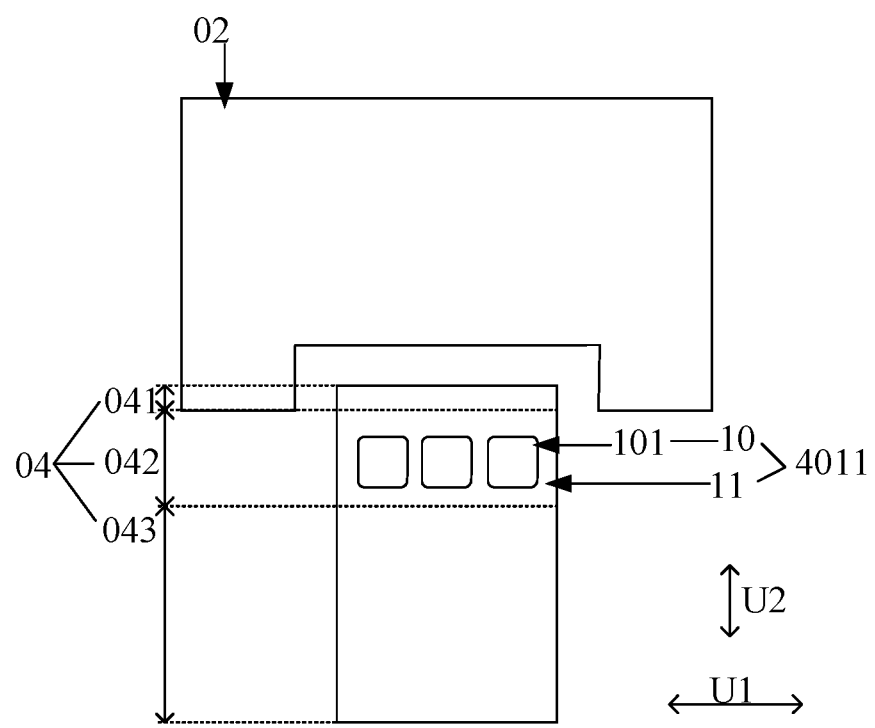
FIG. 8 is a schematic diagram showing a shape of a first insulating layer according to by an embodiment of the present disclosure.

Still optionally, the hollow-out portions in the composite insulating pattern 11 may be arranged in an array. In this case, the target insulating pattern 10 includes a plurality of insulating blocks 101 spaced apart. For example, as shown in FIG. 8, these insulating blocks 101 may be arranged in sequence along a direction U1 of a bending axis of the bending portion 043. Optionally, these insulating blocks 101 may be further arranged in sequence along a bending direction U2 of the bending portion 043. Such an arrangement is not shown in the drawing of the embodiment of the present disclosure. Certainly, when the first insulating layer 041 is made of not only a thermosetting ink but also a composite material of polyimide and a pressure-sensitive adhesive, a structure of the first insulating layer 041 may be different from that of the insulating layer 041 shown in FIG. 8 and FIG. 9, which is not limited in the embodiment of the present disclosure.

Still referring to FIG. 2, the display device may further include a touch drive circuit 08, wherein the touch drive circuit 08 may be disposed on a side, proximal to the display panel 01, of the second portion 042, and electrically connected to the second portion 042.

Figure 10:
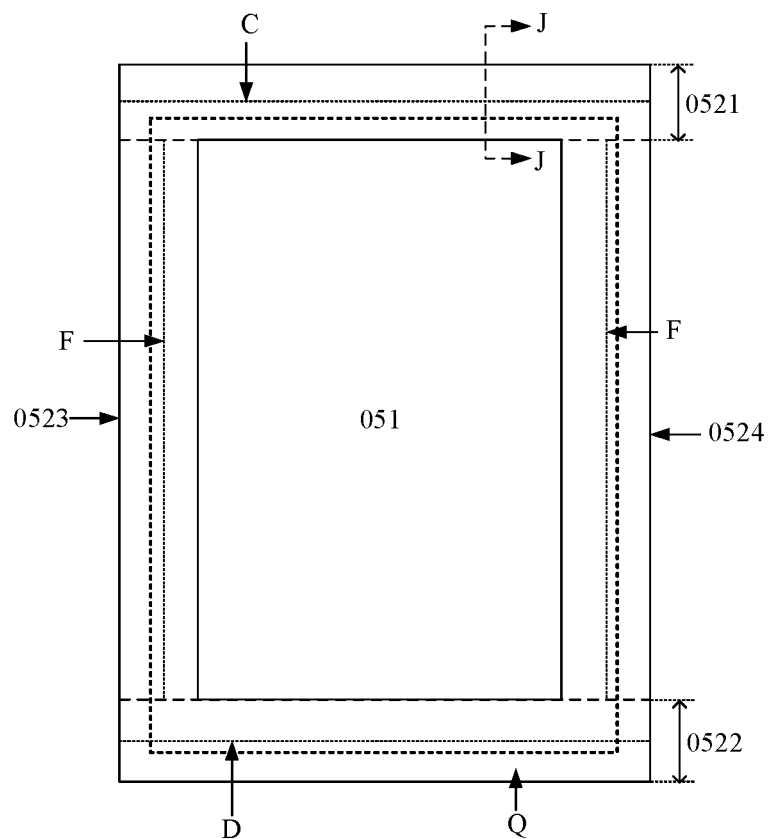
FIG. 10 is a schematic structural diagram of a cover plate according to an embodiment of the present disclosure.

FIG. 10 is a schematic diagram showing a structure of a cover plate according to an embodiment of the present disclosure, and FIG. 2 shows a structure of a cross section B in FIG. 10. Referring to FIG. 2 and FIG. 10, the cover plate 05 may include a center region 051 and an edge region.

A thickness of the edge region gradually decreases in a direction distal from the center region 051. The edge region includes a first subregion 0521 and a second subregion 0522 that are opposite to each other, and a third subregion 0523 and a fourth subregion 0524 that are opposite to each other. The center region 051 is disposed between the first subregion 0521 and the second subregion 0522, and between the third subregion 0523 and the fourth subregion 0524. An orthographic projection of a boundary line C in which the first subregion 0521 is thinned on the reference plane V falls outside an orthographic projection of a display region Q of the display panel 01 on the reference plane V. Orthographic projections of a boundary line D in which the second subregion 0522 is thinned, a boundary line E in which the third subregion 0523 is thinned, and a boundary line G in which the fourth subregion 0524 is thinned on the reference plane V fall within the orthographic projection of the display region Q on the reference plane V, and are proximal to the orthographic projection of an edge of the display region Q on the reference plane V.

Still referring to FIG. 2. the display device may further include a second adhesive layer 09, wherein the second adhesive layer 09 is disposed between the display panel 01 and the touch panel 02. Optionally, the first adhesive layer 06 and the second adhesive layer 09 may be both made of an OCA, and the OCA in the first adhesive layer 06 is an ultraviolet light type OCA, and the OCA in the second adhesive layer 09 is a non-ultraviolet light type OCA.

Figure 11:
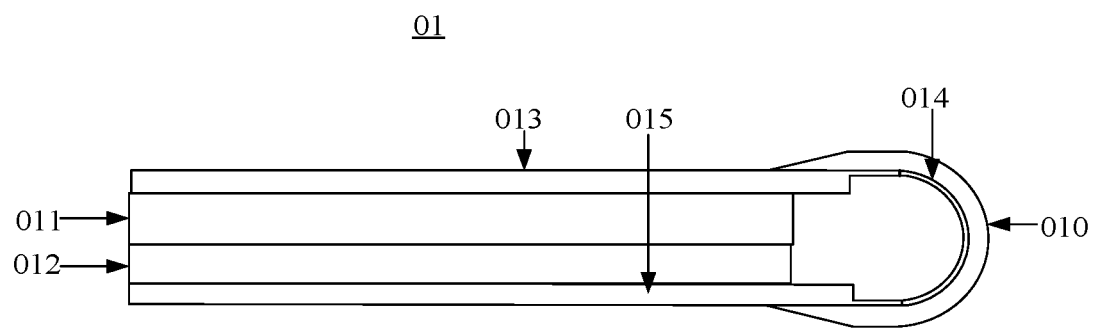
FIG. 11 is a schematic structural diagram of a display panel according to an embodiment of the present disclosure.

HQ. 11 is a schematic structural diagram of a display panel according to an embodiment of the present disclosure. Referring to FIG. 2 and FIG. 11, the display panel 01 includes a PET tape 011 and a buffer foam 012; wherein edges, proximal to the bending portion 043, of the a second adhesive layer 09, the PET tape 011 and the cushion foam 012 are substantially flush, and orthographic projections of the edges of the second adhesive layer 09, the PET tape 011 and the cushion foam 012 on the reference plane V fall within an orthographic projection of the cushion layer 07 on the reference plane V.

Optionally, still referring to FIG. 2 and FIG. 11, the display panel 01 further includes a first panel portion 013, a bending panel portion 014, and a second panel portion 015 connected in sequence; wherein thicknesses of regions, proximal to the bending panel portion 014, of the first panel portion 013 and the second panel portion 015 are the same as a thickness of the bending panel portion 014, and thicknesses of portions, distal from the bending panel portion 014, of the first panel portion 013 and the second panel portion 015 are greater than the thickness of the bending panel portion 014. Optionally, a boundary, proximal to the first portion 041 of the bending panel portion proximal to the first portion 041, of the bending portion 043, and a boundary, proximal to the second portion 042, of the bending panel portion 014 is more proximal to the center of the display region Q of the display panel 01 than a boundary, proximal to the second portion 014, of the bending portion 042.

Optionally, still referring to FIGS. 2 and 11, the display device further includes a coating layer 010, wherein the coating layer 010 covers a surface, proximal to the touch flexible printed circuit board 04, of the bending panel portion 014, and surfaces of portions, proximal to the bending panel portion 014, of the first panel portion 013 and the second panel portion 015. Optionally, the coating layer 010 may be made of an organic silicon rubber or a photoresist and the like. For example, edges of the PET tape 011 and the cushion foam 012 are disposed on thicker portions of the first panel portion 013 and the second panel portion 015, and orthographic projections of the edges of the PET tape 011 and the cushion foam 012 on the reference plane fall within an orthographic projection of the coating layer 010 on the reference plane.

Optionally, the display device in FIG. 2 further includes an insulating protective film 020, wherein the insulating protective film 020 is disposed on a side, distal from the display panel 01, of the second portion 042 of the touch flexible printed circuit board 04.

Optionally, the display de-vice in FIG. 2 further includes an ink layer 030, wherein the ink layer 030 is disposed between an edge region of the cover plate 05 and the first adhesive layer 06.

It should be noted that in the embodiment of the present disclosure, it is exemplified that the display device includes a cushion layer. Optionally, the display device may not include the cushion layer, which is not limited in the embodiment of the present disclosure.

In summary, in the display device according to the embodiment of the present disclosure, the polarizer and the first portion of the TFPC are arranged separately, which may avoid the superposition of the TFPC and the polarizer and ensure that there is no height difference between a potion, which is in contact with the TFPC, of the touch panel and other portions of the touch panel. Accordingly, the risk of the breakage of the touch panel is reduced.

The touch panel and the display panel in the embodiment of the present disclosure are independent of each other. Therefore, the touch panel may be referred to as an external touch panel.

The display device according to the embodiment of the present disclosure may be any product or component with a display function, for example, an electronic paper, a mobile phone, a tablet computer, a television, a display, a notebook computer, a digital photo frame, and a navigator.

It should be noted that in the drawings, the size of layers and regions may be exaggerated for clarity of illustration. Moreover, it should be understood that when an element or layer is referred to as being "on" another element or layer; the element or layer may be directly on the other element or an intervening layer may be present. In addition, it should be understood that when an element or layer is referred to as being "under" another element or layer, the element or layer may be directly under the other element, or more than one intervening layer or element may be present. In addition, it should be further understood that when a layer or element is referred to as being "between" two layers or two elements, the layer or element may be a unique layer between the two layers or two elements, or more than one intervening layer or element may be present, Similar reference signs indicate similar elements throughout the whole text.

In the present disclosure, the terms "first", "second", "third" and "fourth" are for descriptive purposes only and are not to be construed as indicating or implying relative importance. The term "a plurality of" refers to two or more, unless otherwise specifically, defined.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display device, comprising:
a display panel;
a touch panel, disposed on a display side of the display panel;
a polarizer, disposed on a side, distal from the display panel, of the touch panel;
a touch flexible printed circuit board, comprising a first portion, a second portion and a bending portion connecting the first portion and the second portion; wherein the first portion is disposed on a side, distal from the display panel, of the touch panel, the second portion is disposed on a non-display side of the display panel, the first portion is provided with a first connection terminal, and the touch panel is provided with a second connection terminal, the first connection terminal being electrically connected to the second connection terminal;
a cover plate, disposed on a side, distal from the touch panel, of the polarizer;
a first adhesive layer, disposed between the cover plate and the polarizer; and
a cushion layer, disposed between the first portion and the first adhesive layer,
wherein an orthographic projection of the polarizer on a reference plane falls outside an orthographic projection of the first portion on the reference plane, and the reference plane is a plane in which a touch surface of the touch panel is disposed,
wherein the cushion layer comprises a polyethylene terephthalate PET substrate, and a first adhesive and a second adhesive that are stacked on both sides of the PET substrate.

2. The display device according to claim 1, wherein the cushion layer has at least one feature selected from the group consisting of:
a surface, distal from the touch panel, of the cushion layer is substantially flush with a surface, distal from the touch panel, of the polarizer; or
an orthographic projection of the cushion layer on the reference plane substantially coincides with an orthographic projection of the first portion on the reference plane.

3. The display device according to claim 1, wherein the orthographic projection of the polarizer on the reference plane comprises a notch, and an orthographic projection of the first portion on the reference plane is disposed within the notch.

4. The display device according to claim 1, wherein a minimum spacing between the polarizer and the first portion is greater than or equal to 0.23 mm in a direction parallel to the reference plane.

5. The display device according to claim 1, wherein the touch flexible printed circuit board comprises a first insulating layer, a first circuit layer, and a second insulating layer that are stacked in sequence along a direction distal from the touch panel;
wherein the first insulating layer comprises a first insulating portion and a second insulating portion; the first circuit layer comprises a first circuit portion, a second circuit portion, and a third circuit portion; and the second insulating layer comprises a third insulating portion, a fourth insulating portion, and a fifth insulating portion; and
the first portion comprises the first circuit portion and the third insulating portion; the second portion comprises the second insulating portion, the third circuit portion, and the fifth insulating portion; the bending portion comprises the first insulating portion, the second circuit portion, and the fourth insulating portion; the first insulating portion is made of a thermosetting ink, the thermosetting ink being a heat-set ink; and the first circuit unit comprises the first connection terminal.

6. The display device according to claim 5, wherein the second insulating portion and the second insulating layer are both made of a second material, the second material comprising a composite material of polyimide and a pressure sensitive adhesive.

7. The display device according to claim 6, wherein the first insulating portion comprises a target insulating pattern and a composite insulating pattern, and the second insulating portion and the composite insulating pattern are of an integral structure;
   wherein the composite insulating pattern comprises a hollow-out portion, the target insulating pattern is disposed within the hollow-out portion of the composite insulating pattern; the target insulating pattern is made of the thermosetting ink, and the composite insulating pattern is made of the second material; and a thickness of the target insulating pattern is less than that of the composite insulating pattern.

8. The display device according to claim 7, wherein the target insulating pattern comprises at least one of the following: a plurality of insulating blocks spaced apart along a bending direction of the bending portion; or a plurality of insulating blocks spaced apart along a direction of a bending axis of the bending portion.

9. The display device according to claim 5, wherein the second portion comprises a first thickness region and a second thickness region; and the touch flexible printed circuit board further comprises a second circuit layer and a third insulating layer; wherein
   a thickness of the first thickness region is greater than that of the second thickness region; and orthographic projections of boundary lines of the first thickness region and the second thickness region on the reference plane fall outside an orthographic projection of a display region of the display panel on the reference plane; and
   the first thickness region comprises the second insulating portion, the third circuit portion, the fifth insulating portion, the second circuit layer, and the third insulating layer that are stacked in sequence along a direction distal from the display panel.

10. The display device according to claim 1, further comprising at least one selected from the group consisting of:
   a touch drive circuit, disposed on a side, proximal to the display panel, of the second portion and electrically connected to the second portion;
   an insulating protective film, disposed on a side, distal from the display panel, of the second portion of the touch flexible printed circuit board; or
   an ink layer, disposed between an edge region of the cover plate and the first adhesive layer.

11. The display device according to claim 1, wherein the cover plate comprises a center region and an edge region; wherein
   a thickness of the edge region gradually decreases in a direction distal from the center region; the edge region comprises a first subregion and a second subregion that are opposite to each other, and a third subregion and a fourth subregion that are opposite to each other; the center region is disposed between the first subregion and the second subregion and between the third subregion and the fourth subregion;
   wherein an orthographic projection of a boundary line in which the first subregion is thinned on the reference plane falls outside an orthographic projection of the display region of the display panel on the reference plane; orthographic projections of boundary lines in which the second subregion, the third subregion, and the fourth subregion are thinned on the reference plane all fall within the orthographic projection of the display region on the reference plane and are proximal to an orthographic projection of an edge of the display region on the reference plane.

12. The display device according to claim 1, wherein an edge of the touch panel is substantially flush with an edge of the cushion layer.

13. The display device according to claim 1, further comprising a second adhesive layer, wherein the second adhesive layer is disposed between the display panel and the touch panel; and
   the display panel comprises a polyethylene terephthalate PET tape and a buffer foam, wherein edges, proximal to the bending portion, of the second adhesive layer, the PET tape, and the buffer foam are substantially flush, and orthographic projections of the edges of the second adhesive layer, the PET tape, and the buffer foam on the reference plane fall within the orthographic projection of the cushion layer on the reference plane.

14. The display device according to claim 13, wherein the display panel further comprises a first panel portion, a bending panel portion, and a second panel portion that are connected in sequence, wherein thicknesses of regions, proximal to the bending panel portion, of the first panel portion and the second panel portion are the same as the thickness of the bending panel portion, and thicknesses of portions, distal from the bending panel portion, of the first panel portion and the second panel portion are greater than the thickness of the bending panel portion.

15. The display device according to claim 14, wherein a boundary, proximal to the first portion, of the bending panel portion is more proximal to a center of the display region of the display panel than a boundary, proximal to the first portion, of the bending portion; and
   a boundary, proximal to the second portion, of the bending panel portion is more proximal to the center of the display region of the display panel than a boundary, proximal to the second portion, of the bending portion.

16. The display device according to claim 14, further comprising a coating layer;
   wherein the coating layer covers a surface, proximal the touch flexible printed circuit board, of the bending panel portion as well as surfaces of portions, proximal to the bending panel portion, of the first panel portion and the second panel portion.

17. The display device according to claim 16, wherein edges of the PET tape and the buffer foam are disposed on thicker portions of the first panel portion and the second panel portion, and orthographic projections of the edges of the PET tape and the buffer foam on the reference plane fall within an orthographic projection of the coating layer on the reference plane.

18. A display device, comprising:
   a display panel;
   a touch panel, disposed on a display side of the display panel;
   a polarizer, disposed on a side, distal from the display panel, of the touch panel; and
   a touch flexible printed circuit board, comprising a first portion, a second portion and a bending portion connecting the first portion and the second portion; wherein the first portion is disposed on a side, distal from the display panel, of the touch panel, the second portion is disposed on a non-display side of the display panel, the first portion is provided with a first connection terminal, and the touch panel is provided with a second connection terminal, the first connection terminal being electrically connected to the second connection terminal, wherein an orthographic projection of the polarizer on a reference plane falls outside an orthographic projection of the first portion on the reference plane, and the reference plane is a plane in which a touch surface of the touch panel is disposed, wherein the touch flexible printed circuit board comprises a first insulating layer, a first circuit layer, and a second insulating layer that are stacked in sequence along a direction distal from the touch panel;

wherein the first insulating layer comprises a first insulating portion and a second insulating portion; the first circuit layer comprises a first circuit portion, a second circuit portion, and a third circuit portion; and the second insulating layer comprises a third insulating portion, a fourth insulating portion, and a fifth insulating portion; and the first portion comprises the first circuit portion and the third insulating portion; the second portion comprises the second insulating portion, the third circuit portion, and the fifth insulating portion; the bending portion comprises the first insulating portion, the second circuit portion, and the fourth insulating portion; the first insulating portion is made of a thermosetting ink, the thermosetting ink being a heat-set ink; and the first circuit unit comprises the first connection terminal.

19. The display device according to claim 18, further comprising:
- a cushion layer, disposed on a side, distal from the touch panel, of the first portion,
- wherein a surface, distal from the touch panel, of the cushion layer is substantially flush with a surface, distal from the touch panel, of the polarizer.

20. A display device, comprising:
- a display panel;
- a touch panel, disposed on a display side of the display panel;
- a polarizer, disposed on a side, distal from the display panel, of the touch panel; and
- a touch flexible printed circuit board, comprising a first portion, a second portion and a bending portion connecting the first portion and the second portion; wherein the first portion is disposed on a side, distal from the display panel, of the touch panel, the second portion is disposed on a non-display side of the display panel, the first portion is provided with a first connection terminal, and the touch panel is provided with a second connection terminal, the first connection terminal being electrically connected to the second connection terminal,
- wherein an orthographic projection of the polarizer on a reference plane falls outside an orthographic projection of the first portion on the reference plane, and the reference plane is a plane in which a touch surface of the touch panel is disposed,
- wherein the cover plate comprises a center region and an edge region; wherein
- a thickness of the edge region gradually decreases in a direction distal from the center region; the edge region comprises a first subregion and a second subregion that are opposite to each other, and a third subregion and a fourth subregion that are opposite to each other; the center region is disposed between the first subregion and the second subregion and between the third subregion and the fourth subregion;
- wherein an orthographic projection of a boundary line in which the first subregion is thinned on the reference plane falls outside an orthographic projection of the display region of the display panel on the reference plane; orthographic projections of boundary lines in which the second subregion, the third subregion, and the fourth subregion are thinned on the reference plane all fall within the orthographic projection of the display region on the reference plane and are proximal to an orthographic projection of an edge of the display region on the reference plane.

* * * * *